United States Patent
Hayashida et al.

(10) Patent No.: US 10,804,253 B2
(45) Date of Patent: Oct. 13, 2020

(54) SEMICONDUCTOR DEVICE

(71) Applicant: Mitsubishi Electric Corporation, Tokyo (JP)

(72) Inventors: Yukimasa Hayashida, Tokyo (JP); Ryo Tsuda, Tokyo (JP); Ryutaro Date, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/088,735

(22) PCT Filed: Aug. 10, 2016

(86) PCT No.: PCT/JP2016/073549
§ 371 (c)(1),
(2) Date: Sep. 26, 2018

(87) PCT Pub. No.: WO2018/029801
PCT Pub. Date: Feb. 15, 2018

(65) Prior Publication Data
US 2020/0111772 A1    Apr. 9, 2020

(51) Int. Cl.
*H01L 23/00* (2006.01)
*H01L 25/18* (2006.01)

(52) U.S. Cl.
CPC .............. *H01L 25/18* (2013.01); *H01L 24/48* (2013.01); *H01L 24/49* (2013.01);
(Continued)

(58) Field of Classification Search
CPC ......... H01L 25/18; H01L 24/48; H01L 24/49; H01L 2224/48101; H01L 2224/48105;
(Continued)

(56) References Cited

U.S. PATENT DOCUMENTS 6,403,895 B1 * 6/2002 Sota .................. H01L 23/49816
174/260
2002/0047132 A1    4/2002 Fukada et al.
(Continued)

FOREIGN PATENT DOCUMENTS

| JP | 2002-076256 A | 3/2002 |
|---|---|---|
| JP | 2002-368192 A | 12/2002 |
| JP | 2013-021107 A | 1/2013 |

OTHER PUBLICATIONS

International Search Report issued in PCT/JP2016/073549; dated Oct. 18, 2016.
(Continued)

*Primary Examiner* — Nathan W Ha
(74) *Attorney, Agent, or Firm* — Studebaker & Brackett PC

(57) ABSTRACT

First and second circuit patterns (5,6) are provided on an insulating substrate (1). First and second semiconductor chips (7,8) are provided on the first circuit pattern (5). A relay circuit pattern (10) is provided between the first semiconductor chip (7) and the second semiconductor chip (8) on the insulating substrate (1). A wire (11) is continuously connected to the first semiconductor chip (7), the relay circuit pattern (10), the second semiconductor chip (8) and the second circuit pattern (6) which are sequentially arranged in one direction.

6 Claims, 2 Drawing Sheets

(52) U.S. Cl.
CPC ............ *H01L 2224/48101* (2013.01); *H01L 2224/48105* (2013.01); *H01L 2224/48139* (2013.01); *H01L 2224/48225* (2013.01); *H01L 2224/49113* (2013.01); *H01L 2224/49175* (2013.01)

(58) Field of Classification Search
CPC . H01L 2224/48139; H01L 2224/48225; H01L 2224/49113
See application file for complete search history.

(56) References Cited

U.S. PATENT DOCUMENTS

| | | | | |
|---|---|---|---|---|
| 2006/0108601 | A1* | 5/2006 | Okamoto | C23C 28/345 257/177 |
| 2011/0249407 | A1* | 10/2011 | Kawaguchi | H01L 23/053 361/719 |
| 2012/0067623 | A1* | 3/2012 | Park | H01L 23/142 174/252 |
| 2013/0015496 | A1 | 1/2013 | Konno et al. | |
| 2013/0221516 | A1* | 8/2013 | Asada | H01L 23/49524 257/735 |
| 2013/0270687 | A1* | 10/2013 | Kim | H01L 23/3735 257/690 |
| 2014/0167239 | A1* | 6/2014 | Kim | H01L 23/3735 257/676 |
| 2015/0237718 | A1* | 8/2015 | Yamaguchi | H05K 1/092 361/767 |
| 2016/0309575 | A1* | 10/2016 | Min | H05K 1/0206 |
| 2016/0315038 | A1* | 10/2016 | Sato | H01L 25/072 |

OTHER PUBLICATIONS

Written Opinion issued in PCT/JP2016/073549; dated Oct. 18, 2016.

Notification of Transmittal of the International Search Report and the Written Opinion of the International Searching Authority, or the Declaration issued in PCT/JP2016/073549; dated Oct. 18, 2016.

* cited by examiner

SEMICONDUCTOR DEVICE

FIELD

The present invention relates to a semiconductor device.

BACKGROUND

Both the package size and the chip size of highly reliable semiconductor devices have been being downsized, and the degree of integration of semiconductor chips mounted thereon has been increasing. Since semiconductor chips generate heat in electric conduction, the thermal fatigue of wire bonding parts connecting the semiconductor chips determines the service life of a semiconductor device. Interference between the semiconductor chips in terms of generated heat causes a temperature increase, and the temperature of wires connected to the semiconductor chips also increases, which leads to a concern that the service life of the semiconductor device may decrease. To deal with this, a semiconductor device has been proposed in which a relay circuit pattern is provided between opposite semiconductor chips (for example, see PTL 1).

CITATION LIST

Patent Literature

[PTL 1] JP 2013-021107 A

SUMMARY

Technical Problem

Wires, however, connect the opposite semiconductor chips individually to the relay circuit pattern, and hence, there are two wire bonding places on the relay circuit pattern. A wire bonding space is needed by those, and an area where semiconductor chips are mounted cannot be expanded. Moreover, productivity deteriorates since directions of wire bonding from the relay circuit pattern to the opposite semiconductor chips are reverse to each other, which takes time to reverse the directions in a production process.

Moreover, an electrode (for example, see the emitter electrode bonding part 201e in PTL 1) for extracting a signal from a relay circuit pattern (for example, see the emitter wire 106 in PTL 1) is positioned between opposite semiconductor chips. Since when attempting to omit this electrode, the angle of a wire bonding tool is to be complex, it is difficult to continuously connect a wire to the opposite semiconductor chips and the relay circuit pattern. If the wire is continuously connected thereto, the wire is needed to be cut at one of the semiconductor chips, which leads to a concern of deterioration of quality.

The present invention is devised in order to solve the aforementioned problems, and an object thereof is to obtain a semiconductor device capable of preventing deterioration in service life and quality, reducing a wire bonding space, and improving productivity.

Solution to Problem

A semiconductor device according to the present invention includes: an insulating substrate; first and second circuit patterns provided on the insulating substrate; first and second semiconductor chips provided on the first circuit pattern; a relay circuit pattern provided between the first semiconductor chip and the second semiconductor chip on the insulating substrate; and a wire continuously connected to the first semiconductor chip, the relay circuit pattern, the second semiconductor chip and the second circuit pattern which are sequentially arranged in one direction.

Advantageous Effects of Invention

In the present invention, the relay circuit pattern is provided between the first semiconductor chip and the second semiconductor chip. Thereby, since the heat sources are distant from each other, the influence of thermal interference between the opposite first and second semiconductor chips can be prevented to suppress temperature increase. Furthermore, by connecting the wire to the relay circuit pattern, the wire can be cooled with the relay circuit pattern. As a result, the service life of the semiconductor device can be prevented from deteriorating.

Moreover, the wire is continuously connected to the first semiconductor chip, the relay circuit pattern, the second semiconductor chip, and the second circuit pattern which are sequentially arranged in one direction. Thereby, since there is one wire bonding place on the relay circuit pattern, a wire bonding space can be reduced. Further, since the electrode for extracting a signal can be formed on the second circuit pattern, complex wire bonding for preventing this electrode is not needed. Accordingly, since the wire bonding direction is one direction, productivity can be improved. Furthermore, since the wire only has to be cut at the second circuit pattern, quality can be prevented from deteriorating.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
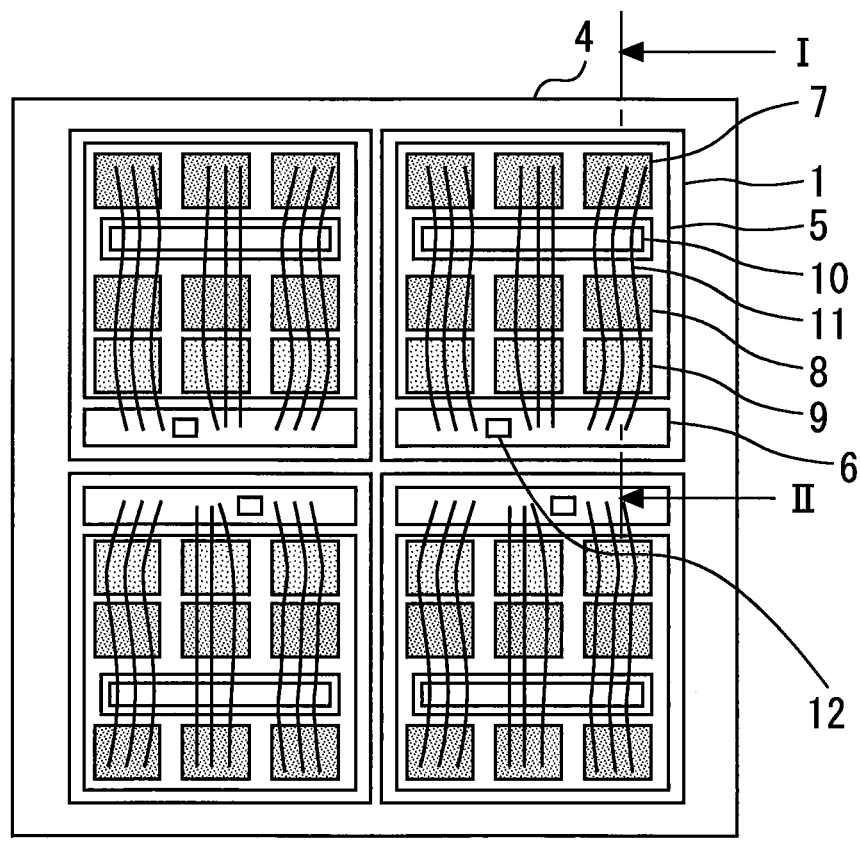
FIG. 1 is a plan view illustrating a semiconductor device according to Embodiment 1 of the present invention.
Figure 2:
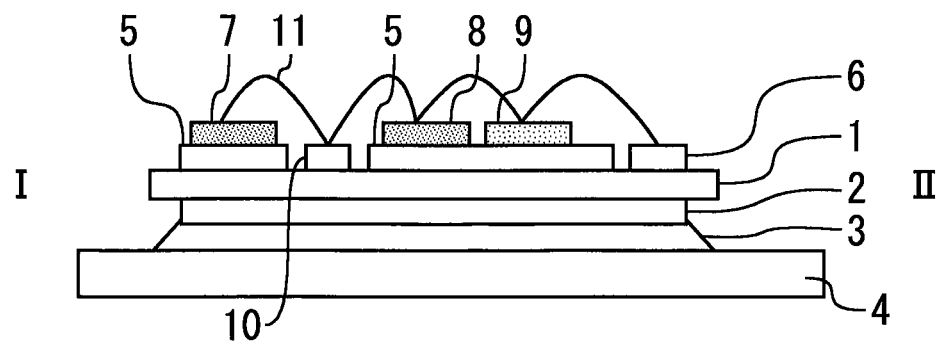
FIG. 2 is a cross-sectional view taken along I-II in FIG. 1.

FIG. 1 is a plan view illustrating a semiconductor device according to Embodiment 1 of the present invention. FIG. 2 is a cross-sectional view taken along I-II in FIG. 1. A lower surface electrode 2 of an insulating substrate 1 is connected to a radiator plate 4 with solder 3 and the like. First and second circuit patterns 5 and 6 are provided on the insulating substrate 1. The first and second circuit patterns 5 and 6 are spaced from each other.

First, second and third semiconductor chips 7, 8 and 9 are sequentially arranged in one direction on the first circuit pattern 5. The first and second semiconductor chips 7 and 8 are IGBTs (Insulated Gate Bipolar Transistors) or MOSFETs (Metal-Oxide-Semiconductor Field-Effect Transistors). The third semiconductor chip 9 is a diode (Di) or an SBD (Schottky Barrier Diode).

On the insulating substrate 1, a relay circuit pattern 10 is provided between the first semiconductor chip 7 and the second semiconductor chip 8. The relay circuit pattern 10 is provided in an opening of the first circuit pattern 5 and is spaced from the first circuit pattern 5. A wire 11 is continuously connected to the first semiconductor chip 7, the relay circuit pattern 10, the second semiconductor chip 8 and the second circuit pattern 6 which are sequentially arranged in one direction. Namely, the first semiconductor chip 7 is the start point of wire bonding, and the second circuit pattern 6 is the end point of the wire bonding. Moreover, an electrode 12 for extracting a signal is provided on the second circuit pattern 6.

In the present embodiment, the relay circuit pattern 10 is provided between the first semiconductor chip 7 and the second semiconductor chip 8. Thereby, since the heat sources are distant from each other, the influence of thermal interference between the opposite first and second semiconductor chips 7 and 8 can be prevented to suppress temperature increase. Furthermore, by connecting the wire 11 to the relay circuit pattern 10, the wire 11 can be cooled with the relay circuit pattern 10. As a result, the service life of the semiconductor device can be prevented from deteriorating.

Moreover, the wire 11 is continuously connected to the first semiconductor chip 7, the relay circuit pattern 10, the second semiconductor chip 8, the third semiconductor chip 9 and the second circuit pattern 6 which are sequentially arranged in one direction. Thereby, since there is one wire bonding place on the relay circuit pattern 10, a wire bonding space can be reduced. Further, since the electrode 12 for extracting a signal can be formed on the second circuit pattern 6, complex wire bonding for preventing this electrode 12 is not needed. Accordingly, since the wire bonding direction is one direction, productivity can be improved. Furthermore, since the wire 11 only has to be cut at the second circuit pattern 6, quality can be prevented from deteriorating.

Moreover, pluralities of each of first and second semiconductor chips 7 and 8 are provided to line up side by side. One relay circuit pattern 10 is integrally provided with respect to the pluralities of first and second semiconductor chips 7 and 8. Further, the relay circuit pattern 10 is electrically connected to upper surface electrodes of the pluralities of first and second semiconductor chips 7 and 8 to have an emitter potential or a source potential, which equalizes the potentials of the upper surface electrodes of the pluralities of first and second semiconductor chips 7 and 8. Therefore, the pluralities of first and second semiconductor chips 7 and 8 can be matched with one another to be in balance in terms of conduction current. Accordingly, since current amounts in chips are matched with one another, electric performance can be improved, that is, unbalanced switching can be handled.

Embodiment 2

In the present embodiment, the relay circuit pattern 10 is higher in thermal conductivity than the first and second circuit patterns 5 and 6. For example, the material of the relay circuit pattern 10 is Ag, Cu, Au or Al, and the material of the first and second circuit patterns 5 and 6 is Fe, SuS, Cu/Mo or Mo. Since cooling performance of the wire 11 is thereby improved, the service life of bonding parts of the wire 11 can be made further longer. Here, when the material of the first and second circuit patterns 5 and 6 is also high thermal conductivity one such as Ag or Au, costs for the materials largely increase, and it becomes difficult to secure a bonding material for the first, second and third semiconductor chips 7, 8 and 9, a bonding property therefor, and H/C reliability thereof. Meanwhile, since for the relay circuit pattern 10, a wire bonding property only has to be considered, a high thermal conductivity material can be used therefor.

Embodiment 3

Figure 3:
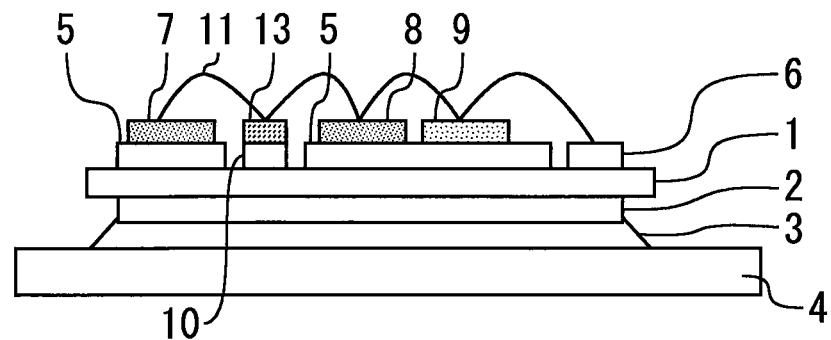
FIG. 3 is a cross-sectional view illustrating a semiconductor device according to Embodiment 3 of the present invention.

FIG. 3 is a cross-sectional view illustrating a semiconductor device according to Embodiment 3 of the present invention. In the present embodiment, a high thermal conductivity film 13 higher in thermal conductivity than the relay circuit pattern 10 and the first and second circuit patterns 5 and 6 is formed on the relay circuit pattern 10 by plating or the like. The material of the high thermal conductivity film 13 is Ag, Cu, Au or Al, and the material of the relay circuit pattern 10 and the first and second circuit patterns 5 and 6 is Fe, SuS, Cu/Mo or Mo. Thereby, the similar effect to that for the Embodiment 2 can be obtained.

Embodiment 4

Figure 4:
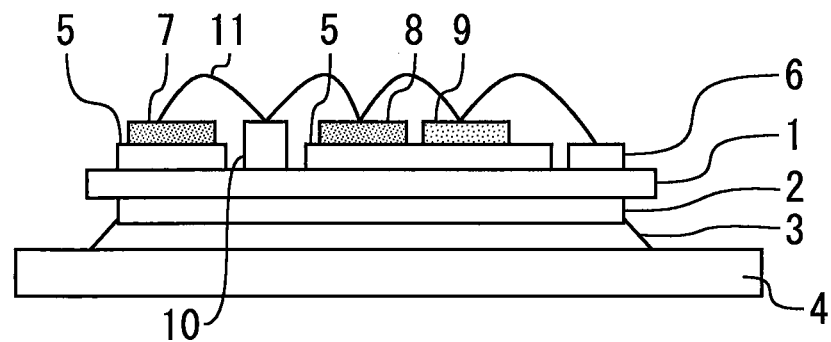
FIG. 4 is a cross-sectional view illustrating a semiconductor device according to Embodiment 4 of the present invention.

FIG. 4 is a cross-sectional view illustrating a semiconductor device according to Embodiment 4 of the present invention. In the present embodiment, the thickness of the relay circuit pattern 10 is larger than the thickness of the first and second circuit patterns 6. The height of the upper surface of the relay circuit pattern 10 is not less than the height of the upper surfaces of the first and second semiconductor chips 7 and 8. Thereby, since the length of the wire 11 can be reduced, heat generation of the wire 11 can be reduced, and the service life of bonding parts of the wire 11 can be made further longer.

In Embodiments 1 to 4, the first, second and third semiconductor chips 7, 8 and 9 are not limited to silicon. The semiconductor chips may be formed of a wide-band-gap semiconductor having a band gap larger than that of silicon. The wide-band-gap semiconductor is, for example, silicon carbide, a gallium nitride-based material or diamond. Although a pattern area becomes large for forming the relay circuit pattern 10 and the second circuit pattern 6, a chip area can be downsized by configuring the first, second and third semiconductor chips 7, 8 and 9 of wide bandgap semiconductors.

A semiconductor chip formed of such a wide-band-gap semiconductor has a high withstand voltage and a high allowable current density and can therefore be reduced in size. A semiconductor device incorporating the semiconductor chip reduced in size can also be reduced in size. Also, radiating fins of a heat sink can be made smaller in size and a water-cooling part can be replaced with an air-cooling part, because the semiconductor chip has high heat resistance. Also, the semiconductor chip has a low power loss and high efficiency and the efficiency of the semiconductor device can therefore be improved.

REFERENCE SIGNS LIST 1 insulating substrate; 5 first circuit pattern; 6 second circuit pattern; 7 first semiconductor chip; 8 second semiconductor chip; 10 relay circuit pattern; 11 wire; 13 high thermal conductivity film

The invention claimed is:

1. A semiconductor device comprising:
an insulating substrate;
first and second circuit patterns provided on the insulating substrate;
first and second semiconductor chips provided on the first circuit pattern;
a relay circuit pattern provided between the first semiconductor chip and the second semiconductor chip on the insulating substrate; and
a wire continuously connected to the first semiconductor chip, the relay circuit pattern, the second semiconductor chip and the second circuit pattern which are sequentially arranged in one direction.

2. The semiconductor device according to claim 1, wherein pluralities of each of the first and second semiconductor chips are provided, and
the relay circuit pattern is electrically connected to upper surface electrodes of the pluralities of first and second semiconductor chips to equalize potentials of the upper surface electrodes of the pluralities of first and second semiconductor chips.

3. The semiconductor device according to claim 1, wherein the relay circuit pattern is higher in thermal conductivity than the first and second circuit patterns.

4. The semiconductor device according to claim 1, further comprising a high thermal conductivity film which is provided on the relay circuit pattern and higher in thermal conductivity than the relay circuit pattern and the first and second circuit patterns.

5. The semiconductor device according to claim 1, wherein thickness of the relay circuit pattern is larger than thickness of the first and second circuit patterns, and
height of an upper surface of the relay circuit pattern is not less than height of upper surfaces of the first and second semiconductor chips.

6. The semiconductor device according to claim 1, wherein
the wire is a single wire, the first semiconductor chip is a start point of wire bonding of the single wire and the second circuit pattern is an end point of wire bonding of the single wire.

* * * * *